(12) United States Patent
Chiu et al.

(10) Patent No.: US 12,102,021 B2
(45) Date of Patent: Sep. 24, 2024

(54) SEMICONDUCTOR DEVICE AND MANUFACTURING METHOD OF SEMICONDUCTOR DEVICE

(71) Applicant: XIAMEN INDUSTRIAL TECHNOLOGY RESEARCH INSTITUTE CO., LTD., Fujian (CN)

(72) Inventors: Taiwei Chiu, Xiamen (CN); Tingying Shen, Xiamen (CN); He Qian, Xiamen (CN)

(73) Assignee: XIAMEN INDUSTRIAL TECHNOLOGY RESEARCH INSTITUTE CO., LTD., Xiamen (CN)

( * ) Notice: Subject to any disclaimer, the term of this patent is extended or adjusted under 35 U.S.C. 154(b) by 152 days.

(21) Appl. No.: 18/009,525

(22) PCT Filed: Jun. 29, 2021

(86) PCT No.: PCT/CN2021/103130
§ 371 (c)(1),
(2) Date: Dec. 9, 2022

(87) PCT Pub. No.: WO2022/017137
PCT Pub. Date: Jan. 27, 2022

(65) Prior Publication Data
US 2023/0225229 A1    Jul. 13, 2023

(30) Foreign Application Priority Data

Jul. 20, 2020   (CN) .......................... 202010697207.4

(51) Int. Cl.
*H10B 63/00*    (2023.01)
*H10N 70/00*    (2023.01)

(52) U.S. Cl.
CPC .......... *H10N 70/8833* (2023.02); *H10B 63/80* (2023.02); *H10N 70/021* (2023.02); *H10N 70/063* (2023.02); *H10N 70/841* (2023.02)

(58) Field of Classification Search
CPC ............. H10N 70/8833; H10N 70/021; H10N 70/063; H10N 70/841; H10N 70/24;
(Continued)

(56) References Cited

U.S. PATENT DOCUMENTS 10,636,842 B1 * 4/2020 Cheng .................. H10N 70/841
10,847,578 B1 * 11/2020 Chen .................... H10N 70/063
(Continued)

FOREIGN PATENT DOCUMENTS

CN           1574288 A       2/2005
CN         101345289 A       1/2009
(Continued)

OTHER PUBLICATIONS

International Search Report dated Sep. 29, 2021, in International Patent Application No. PCT/CN2021/103130 (7 pages).

*Primary Examiner* — Michael T Tran
(74) *Attorney, Agent, or Firm* — Maier & Maier, PLLC

(57) ABSTRACT

A semiconductor device and a manufacturing method of the semiconductor device. The semiconductor device includes: a semiconductor substrate; a bottom electrode metal layer and a top electrode metal layer located on the semiconductor substrate; a resistive layer located between the bottom electrode metal layer and the top electrode metal layer, where the transverse width of the resistive layer is greater than the transverse width of the bottom electrode metal layer and/or the top electrode metal layer, and the resistive layer has a variable resistance; an oxygen barrier layer located between the bottom electrode metal layer and the top electrode metal layer, where the oxygen barrier layer is
(Continued)

located above the resistive layer; and an oxygen grasping layer located between the bottom electrode metal layer and the top electrode metal layer, where the transverse width of the oxygen grasping layer is less than the transverse width of the resistive layer.

11 Claims, 3 Drawing Sheets

(58) Field of Classification Search
CPC .... H10N 70/801; H10N 70/826; H10N 70/20; H10N 70/061; H10B 63/80
USPC .................................................. 365/148, 158
See application file for complete search history.

(56) References Cited

U.S. PATENT DOCUMENTS

| | | | |
|---|---|---|---|
| 2014/0061570 A1 | 3/2014 | Fuji et al. | |
| 2016/0005956 A1* | 1/2016 | Tang | G11C 11/1675 257/421 |
| 2017/0309682 A1* | 10/2017 | Chou | H01L 23/5226 |
| 2019/0315106 A1* | 10/2019 | Cho | B32B 27/306 |
| 2020/0082885 A1* | 3/2020 | Lin | H01L 23/5226 |
| 2020/0091408 A1* | 3/2020 | Sundar | H01F 41/34 |
| 2020/0343445 A1* | 10/2020 | Strutt | H10N 70/24 |
| 2020/0365591 A1* | 11/2020 | Kunitake | G11C 11/4023 |

FOREIGN PATENT DOCUMENTS

| | | |
|---|---|---|
| CN | 101552321 A | 10/2009 |
| CN | 102301425 A | 12/2011 |
| CN | 106159086 A | 11/2016 |
| CN | 106374040 A | 2/2017 |
| CN | 112002801 A | 11/2020 |
| CN | 102610746 A | 7/2021 |

* cited by examiner

SEMICONDUCTOR DEVICE AND MANUFACTURING METHOD OF SEMICONDUCTOR DEVICE

CROSS REFERENCE TO RELATED APPLICATION

The present disclosure is based on the Chinese patent application No. 202010697207.4, filed on Jul. 20, 2020, with a title of "SEMICONDUCTOR DEVICE AND MANUFACTURING METHOD OF SEMICONDUCTOR DEVICE", and claims the priority of the Chinese patent application, the entire contents of which are hereby incorporated by reference.

TECHNICAL FIELD

The present disclosure relates to the field of semiconductor technologies, in particular to a semiconductor device and a manufacturing method of the semiconductor device.

BACKGROUND

As a new non-volatile memory, Resistive Random Access Memory (RRAM) has advantages of simple structure, fast work speed, low power consumption and stable information retention, which is one of strong competitors of the next generation non-volatile memory.

FIG. 1 is a structural diagram of an existing RRAM. The RRAM includes a bottom electrode metal layer 101, a resistive layer 108, an oxygen barrier layer 109, an oxygen grasping layer 110, and a top electrode metal layer 103 provided and stacked from bottom to top. The resistive layer 108 with a resistive effect interconverts between resistance states (high resistance state and low resistance state) under the action of applied voltage, forming binary information storage of "0" state and "1" state. Many materials, including metal oxide, have outstanding resistive performance A resistive mechanism is based on the formation of a conductive filament by the aggregation of oxygen vacancies and other defects. After the grasping oxygen layer grasps oxygen atoms in a metal oxide resistive material, the oxygen vacancies are left in the resistive material, which is a main defect in the metal oxide resistive material.

A resistive structure of the existing RRAM is produced by etching after being deposited one time. A location of an area formed by the conductive filament in the resistive layer cannot be predicted. If a sidewall of the resistive layer is damaged during the etching, defects in the resistive layer will be concentrated on the sidewall of the resistive layer, which may cause that the conductive filament is produced on the sidewall of the resistive layer, thereby reducing reliability of the RRAM, and hindering large-scale integration and practical application of the RRAM.

SUMMARY

A purpose of embodiments of the present disclosure is to provide a semiconductor device and a manufacturing method of the semiconductor device, in order to at least solve the above technical problem.

To achieve the above purpose, the embodiments of the present disclosure provide a semiconductor device, including:

a bottom electrode metal layer and a top electrode metal layer;

a resistive layer located between the bottom electrode metal layer and the top electrode metal layer, where the transverse width of the resistive layer is greater than the transverse width of the bottom electrode metal layer and/or the top electrode metal layer, and the resistive layer has a variable resistance;

an oxygen barrier layer located between the bottom electrode metal layer and the top electrode metal layer, where the oxygen barrier layer is located above the resistive layer; and an oxygen grasping layer located between the bottom electrode metal layer and the top electrode metal layer, where the transverse width of the oxygen grasping layer is less than the transverse width of the resistive layer, and the oxygen grasping layer is located above the oxygen barrier layer.

Sidewalls of the bottom electrode metal layer, the top electrode metal layer and the oxygen grasping layer are metal oxidation areas.

The transverse width of the oxygen grasping layer is less than the transverse width of the bottom electrode metal layer and/or the top electrode metal layer; or the transverse width of the oxygen grasping layer is greater than the transverse width of the bottom electrode metal layer and/or the top electrode metal layer.

An outer side of the semiconductor device is covered with a sidewall oxygen isolation protective layer to isolate an oxygen atom outside the semiconductor device.

A composition material of the resistive layer is one or more of aluminium hafnium oxide (HfAlO), hafnium oxide (HfOx), aluminium oxide (AlOx), and tantalic oxide (TaOx).

A composition material of the oxygen grasping layer includes one or more of titanium (Ti), zirconium (Zr), hafnium (Hf), tantalum (Ta), and aluminum (Al).

A composition material of the oxygen barrier layer and the sidewall oxygen isolation protective layer includes one or more of aluminum oxide (Al2O3), titanium oxide (TiOx), and titanium oxynitride (TiON).

The embodiments of the present disclosure further provide a manufacturing method of a semiconductor device, including:

depositing a bottom electrode metal layer material on a semiconductor substrate;

depositing a resistive layer material on the bottom electrode metal layer material;

depositing an oxygen barrier layer material on the resistive layer material;

depositing an oxygen grasping layer material on the oxygen barrier layer material;

depositing a top electrode metal layer material on the oxygen grasping layer material;

patterning the bottom electrode metal layer material, the resistive layer material, the oxygen barrier layer material, the oxygen grasping layer material, and the top electrode metal layer material to form a bottom electrode metal layer, a resistive layer, an oxygen barrier layer, an oxygen grasping layer, and a top electrode metal layer; and etching the bottom electrode metal layer, the oxygen grasping layer and the top electrode metal layer, so that the transverse width of the bottom electrode metal layer, the oxygen grasping layer, and the top electrode metal layer are less than the transverse width of the resistive layer.

The etching the bottom electrode metal layer, the oxygen grasping layer, and the top electrode metal layer includes:

etching the bottom electrode metal layer, the oxygen grasping layer, and the top electrode metal layer by a wet etching process, and forming a metal oxidation area on sidewalls of the bottom electrode metal layer, the oxygen grasping layer, and the top electrode metal layer.

A sidewall oxygen isolation protective layer material is deposited on an outer side of the semiconductor device to form a sidewall oxygen isolation protective layer.

In the above embodiments, the transverse width of the bottom electrode metal layer, the oxygen grasping layer, and the top electrode metal layer of the semiconductor device is less than the transverse width of the resistive layer, and when applying voltage to the semiconductor device, an electric field action area on the resistive layer is reduced, so that a conductive filament is more concentratedly formed in the center of the resistive layer, thereby avoiding to form the conductive filament in a sidewall area of the resistive layer.

Other features and advantages of the embodiments in the present disclosure will be described in detail in the following description of embodiments.

BRIEF DESCRIPTION OF THE DRAWINGS

The drawings are used to provide further understanding of the present disclosure and constitute a part of the specification, and to explain the embodiments of the present disclosure together with the following description of embodiments, but do not constitute the limitation to the embodiments of the present disclosure. In the drawings.

DETAILED DESCRIPTION

Figure 1:
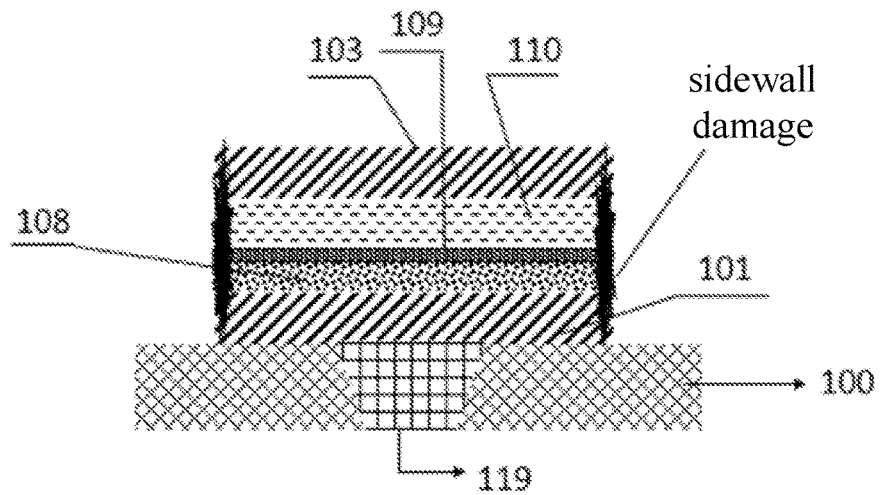
FIG. 1 shows a structural diagram of an existing RRAM.

Various exemplary embodiments of the present disclosure will now be described in detail with reference to the drawings. It should be noted that, unless otherwise specified, relative arrangements, numerical expressions and values of components and steps described in the embodiments do not limit the scope of the present disclosure.

At the same time, it should be understood that, for the convenience of description, dimensions of each part shown in the drawings are not drawn according to an actual proportional relationship.

The following description of at least one exemplary embodiment is in fact merely illustrative, and in no way serves as any limitation on the present disclosure and application or use thereof.

The technologies, methods and equipments known to those ordinary skilled in the related fields may not be discussed in detail, but if appropriate, the technologies, methods and equipments shall be considered as a part of the authorized specification.

In all the examples shown and discussed herein, any specific value should be explained as merely illustrative, but not limitations. Therefore, other examples of the exemplary embodiments may have different values.

Figure 2:
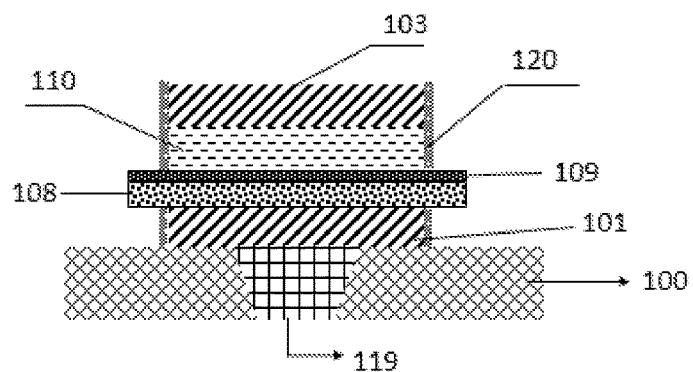
FIG. 2 shows a cross-sectional view of a semiconductor device according to an embodiment of the present disclosure.

FIG. 2 shows a cross-sectional view of a semiconductor device according to an embodiment of the present disclosure.

In one embodiment of the present disclosure, the semiconductor device is a RRAM. First of all, referring to FIG. 2, the semiconductor device is located on a semiconductor substrate 100, including: a bottom electrode metal layer 101 and a top electrode metal layer 103 located on the semiconductor substrate 100; a resistive layer 108 located between the bottom electrode metal layer 101 and the top electrode metal layer 103, where the transverse width of the resistive layer 108 is greater than the transverse width of the bottom electrode metal layer 101 and/or the top electrode metal layer 103, and the resistive layer 108 has a variable resistance; an oxygen barrier layer 109 located between the bottom electrode metal layer 101 and the top electrode metal layer 103, where the oxygen barrier layer 109 is located above the resistive layer 108; and an oxygen grasping layer 110 located between the bottom electrode metal layer 101 and the top electrode metal layer 103, where the transverse width of the oxygen grasping layer 110 is less than the transverse width of the resistive layer 108, and the oxygen grasping layer 110 is located above the oxygen barrier layer 109. The bottom electrode metal layer 101 and the top electrode metal layer 103 constitute a conductive connection layer of the semiconductor device. As a preferred embodiment, a composition material of the bottom electrode metal layer 101 and the top electrode metal layer 103 includes one or more of titanium (Ti), tantalum (Ta), titanium nitride (TiN), and tantalum nitride (TaN). A bottom electrode through hole 119 is also formed in the semiconductor substrate 100. As an embodiment, a composition material of the bottom electrode through hole 119 is conductive metal for being electrically connected with the semiconductor device (that is, RRAM) above the semiconductor substrate 100.

Back to FIG. 2, the transverse width of the oxygen barrier layer 109 is the same as the transverse width of the resistive layer 108, the oxygen barrier layer 109 completely covers the resistive layer 108, and a composition material of the oxygen barrier layer 109 is metal oxide. As a preferred embodiment, a composition material of the oxygen barrier layer 109 includes one or more of aluminum oxide ($Al_2O_3$), titanium oxide ($TiO_x$), and titanium oxynitride ($TiON$). The composition material of the resistive layer 108 is transitional metal oxide. As a preferred embodiment, a composition material of the resistive layer 108 includes one or more of aluminium hafnium oxide ($HfAlO$), hafnium oxide ($HfO_x$), aluminium oxide ($AlO_x$), and tantalic oxide ($TaO_x$). A function of the oxygen barrier layer 109 is to prevent spread of oxygen atoms in the resistive layer 108.

As shown in FIG. 2, the oxygen grasping layer 110 partially covers the oxygen barrier layer 109, and a function of the oxygen grasping layer 110 is to grasp the oxygen atoms in the resistive layer 108. As the oxygen atoms in the resistive layer 108 are grasped by the oxygen grasping layer 110, oxygen vacancies shall be left in the resistive layer 108. With the continuous aggregation of the oxygen vacancies, a conductive filament can be formed in the resistive layer 108, so that a resistance state of the semiconductor device is changed. The oxygen grasping layer 110 is made of a metal material. As a preferred embodiment, a composition material of the oxygen grasping layer 110 includes one or more of titanium (Ti), zirconium (Zr), hafnium (Hf), tantalum (Ta), and aluminum (Al).

Figure 3:
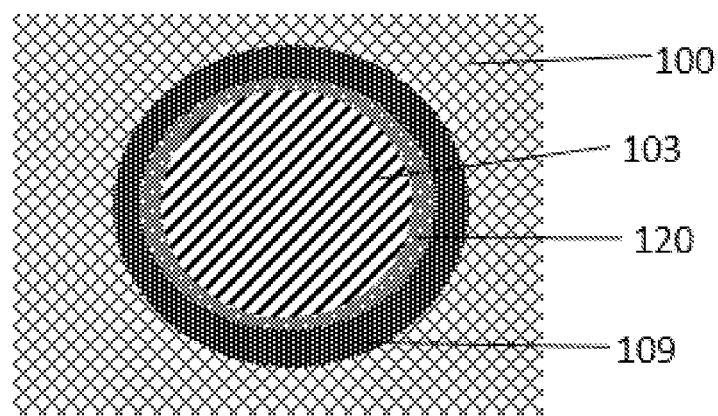
FIG. 3 shows a top view of a semiconductor device according to an embodiment of the present disclosure.

In one embodiment of the present disclosure, the RRAM shown in FIG. 1 can be processed to obtain the semiconductor device shown in FIG. 2: the bottom electrode metal layer 101, the oxygen grasping layer 110, and the top electrode metal layer 103 of the RRAM shown in FIG. 1 are etched from side to inside, in order to shorten the transverse width of the bottom electrode metal layer 101, the oxygen grasping layer 110, and the top electrode metal layer 103. FIG. 3 shows a top view of a semiconductor device according to an embodiment of the present disclosure.

Since the bottom electrode metal layer 101, the top electrode metal layer 103 and the oxygen grasping layer 110 are all composed of the metal material, a wet etching process can be adopted to etch the three in a manufacturing process, and the same etching solution can be used. As a preferred embodiment, they can be etched with a mixed solution of hydrogen dioxide (H2O2) (such as SC1 or SC2). After etching the bottom electrode metal layer 101, the top electrode metal layer 103, and the oxygen grasping layer 110, not only the transverse width is shortened, but also an edge metal material of the three layers can react with the mixed solution of hydrogen peroxide (H2O2), thereby forming a metal oxidation area 120 at edges of the bottom electrode metal layer 101, the top electrode metal layer 103, and the oxygen grasping layer 110.

The transverse width of the bottom electrode metal layer 101, the top electrode metal layer 103 and the oxygen grasping layer 110 shown in FIG. 2 are the same. It should be noted that in another embodiment of the present disclosure, the transverse width of the bottom electrode metal layer 101, the top electrode metal layer 103 and the oxygen grasping layer 110 may also be different.

If the transverse width of any one of the bottom electrode metal layer 101 and the top electrode metal layer 103 is reduced, the electric field area will be reduced accordingly, that is, the electric field area is a part where the bottom electrode metal layer 101 overlaps with the top electrode metal layer 103. Therefore, in order that an electric field acts on a central area of the resistive layer 108, the overlapping part of the bottom electrode metal layer 101 and the top electrode metal layer 103 should be ensured to overlap with the central area of the resistive layer 108. That is, as long as the transverse width of any one of the bottom electrode metal layer 101 and the top electrode metal layer 103 is less than the transverse width of the resistive layer 108, a purpose of reducing the electric field area can be achieved.

The failure of metal properties of the metal oxidation area 120 can further promote the formation of the conductive filament in the central area of the resistive layer 108. This is because after sidewalls of the bottom electrode metal layer 101 and the top electrode metal layer 103 are oxidized, the electric field can be more concentrated in the central area (a pure metal part) of each layer. After the sidewall of the oxygen grasping layer 110 is oxidized, the oxidized area can no longer grasp the oxygen atoms. Further, a function of grasping the oxygen atoms is also concentrated in the central area (the pure metal part) of the oxygen grasping layer 110. In this way, both the electric field and oxygen atom grasping act on the central area, which can promote the formation of the conductive filament in the central area of the resistive layer 108.

In another embodiment of the present disclosure, the transverse width of the oxygen grasping layer 110 can be further shortened, so that the transverse width of the oxygen grasping layer is less than the transverse width of the bottom electrode metal layer and/or the top electrode metal layer (that is, the transverse width of the oxygen grasping layer 110 is less than the transverse width of the overlapping part of the bottom electrode metal layer 101 and the top electrode metal layer 103), and the oxygen grasping layer 110 is merely covered on the central area of an upper surface of the oxygen barrier layer 109, which can cause that the formation of the conductive filament in the semiconductor device can be concentrated in the central area of the resistive layer 108 (that is, an area where the oxygen atoms are grasped can be further reduced on the basis of reducing the electric field area, so that the conductive filament can be more concentratedly formed in the central area of the resistive layer 108).

In another embodiment of the present disclosure, it is also possible to cause that the transverse width of the oxygen grasping layer 110 is greater than the transverse width of the bottom electrode metal layer 101 and/or the top electrode metal layer 103, that is, an oxygen atom grasping area is greater than the electric field area, and the conductive filament will be merely formed in an overlapping area of the oxygen atom grasping area and the electric field area.

It can be seen from the above embodiments that in order to form the conductive filament in a specific area of the resistive layer 108, as long as an area where the electric field area overlaps with the oxygen atom grasping area can be ensured to be correspond to the specific area of the resistive layer 108.

Figure 4:
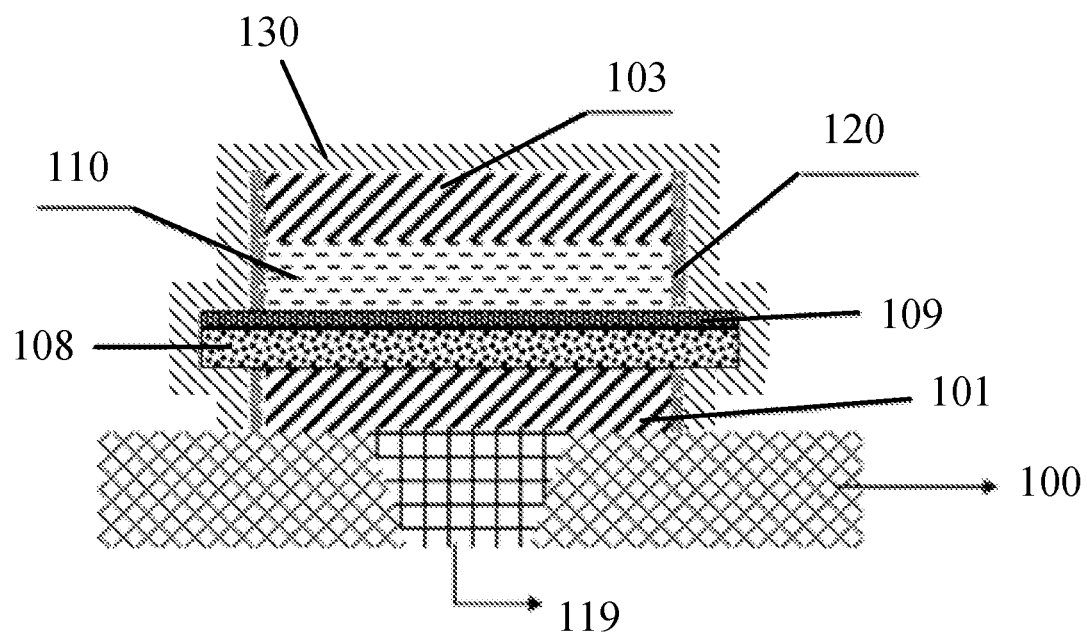
FIG. 4 shows a cross-sectional view of a semiconductor device according to another embodiment of the present disclosure.

In one embodiment of the present disclosure, as shown in FIG. 4, an outer side of the semiconductor device, that is, the outer side of the bottom electrode metal layer, the resistive layer, the oxygen barrier layer, the oxygen grasping layer, and the top electrode metal layer, is covered with a sidewall oxygen isolation protective layer 130, which is used to isolate the oxygen atoms outside the semiconductor device, and can prevent the oxygen grasping layer 110 from being interfered by the external oxygen atoms when grasping the oxygen atoms from the resistive layer 108.

Compared with the prior art, the embodiments of the present disclosure cause that the bottom electrode metal layer, the oxygen grasping layer, and the top electrode metal layer merely overlap with the central area of the resistive layer by shortening the transverse width of the bottom electrode metal layer, the oxygen grasping layer, and the top electrode metal layer of the semiconductor device, thereby reducing an electric field action area on the resistive layer when applying voltage to the semiconductor device (a part where the resistive layer do not overlap with the bottom electrode metal layer, the oxygen grasping layer, and the top electrode metal layer will not produce an effect of the electric field), so that the conductive filament is more concentratedly formed in the center of the resistive layer, avoiding the formation of the conductive filament in a sidewall area of the resistive layer.

Figure 5:
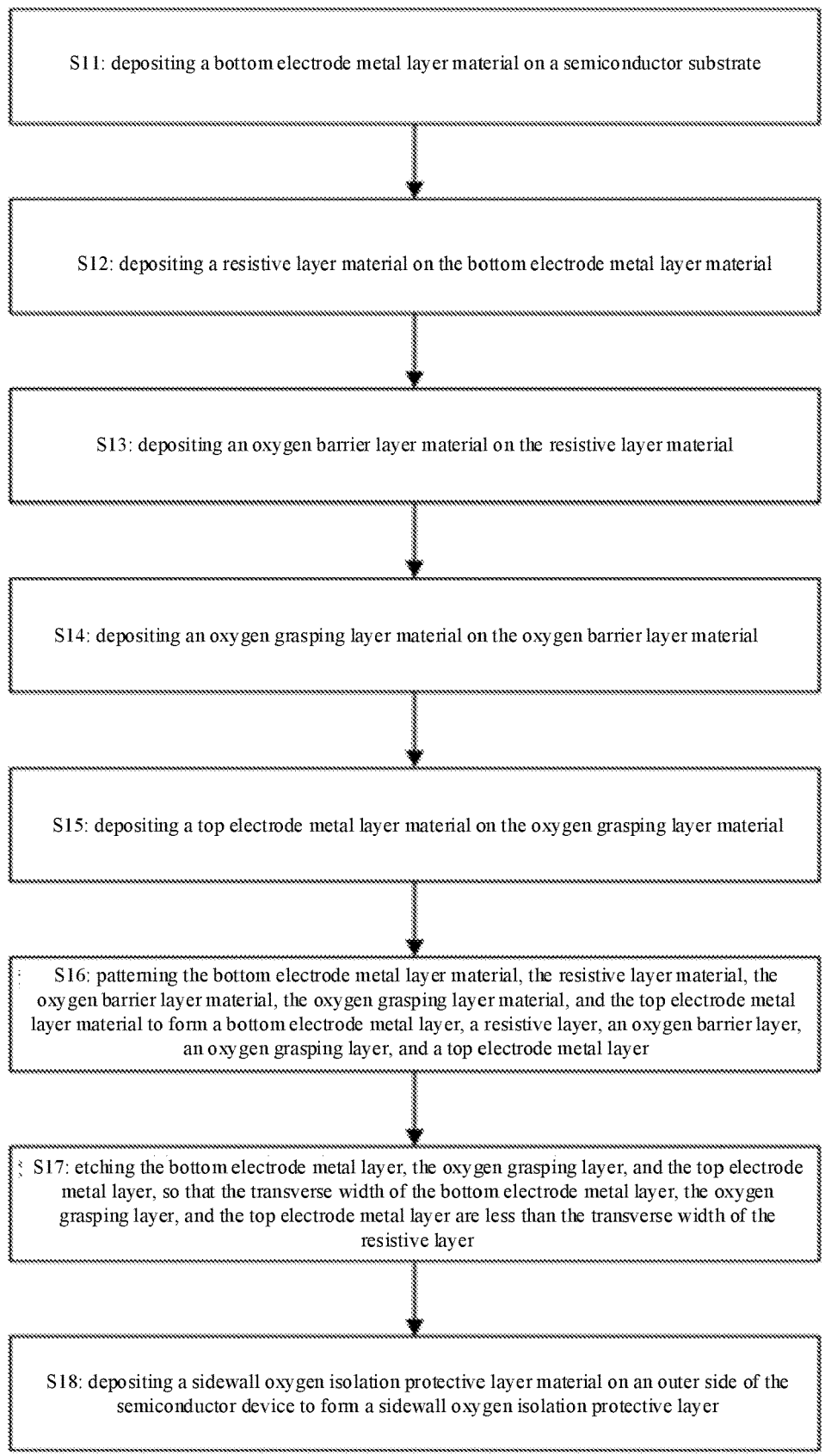
FIG. 5 shows a flowchart of a manufacturing method of a semiconductor device according to an embodiment of the present disclosure.

The present disclosure further provides a manufacturing method of a semiconductor device, as shown in FIG. 5, including:

step S11: depositing a bottom electrode metal layer material on a semiconductor substrate;

step S12: depositing a resistive layer material on the bottom electrode metal layer material;

step S13: depositing an oxygen barrier layer material on the resistive layer material;

step S14: depositing an oxygen grasping layer material on the oxygen barrier layer material;

step S15: depositing a top electrode metal layer material on the oxygen grasping layer material;

step S16: patterning the bottom electrode metal layer material, the resistive layer material, the oxygen barrier layer material, the oxygen grasping layer material, and the top electrode metal layer material to form a bottom electrode metal layer, a resistive layer, an oxygen barrier layer, an oxygen grasping layer, and a top electrode metal layer;

step S17: etching the bottom electrode metal layer, the oxygen grasping layer, and the top electrode metal layer, so that the transverse width of the bottom electrode metal layer, the oxygen grasping layer, and the top electrode metal layer is less than the transverse width of the resistive layer;

here, a wet etching process can be used to etch the bottom electrode metal layer, the oxygen grasping layer, and the top electrode metal layer, shorten the transverse width of the bottom electrode metal layer, the oxygen grasping layer, and the top electrode metal layer, and form a metal oxidation area (120 in FIG. 2) on sidewalls of the bottom electrode metal layer, the oxygen grasping layer, and the top electrode metal layer; and step S18: depositing a sidewall oxygen isolation protective layer material on an outer side of the semiconductor device to form a sidewall oxygen isolation protective layer.

As shown in FIG. 4, the sidewall oxygen isolation protective layer is formed on the outer side of the bottom electrode metal layer, the resistive layer, the oxygen barrier layer, the oxygen grasping layer, and the top electrode metal layer.

The sidewall oxygen isolation protective layer can prevent the external oxygen atoms from interfering with the oxygen grasping layer 110 to grasp the oxygen atoms in the resistive layer 108.

In one embodiment, a composition material of the oxygen barrier layer and the sidewall oxygen isolation protective layer includes one or more of aluminum oxide (Al2O3), titanium oxide (TiOx) and titanium oxynitride (TiON).

It should be pointed out here is that the above description of the embodiment of the manufacturing method of the semiconductor device is similar to the foregoing description of the embodiment of the semiconductor device shown in FIG. 2, and has beneficial effects similar to the foregoing embodiment of the semiconductor device shown in FIG. 2. Therefore, it will not be repeated.

The foregoing description is intended to enable those skilled in the art to implement and use the content of the present disclosure, and is provided in the context of specific applications and their requirements. In addition, the foregoing description of the embodiments of the present disclosure is given merely for the purpose of illustration and description. They are not intended to be exhaustive or to limit the present disclosure to the disclosed form. Therefore, many modifications and variations will be obvious for those skilled practitioners in the art, and the general principles defined herein can be applied to other embodiments and applications without departing from the essence and scope of the present disclosure. In addition, the foregoing discussion of the embodiments is not intended to limit the present disclosure. Therefore, the present disclosure is not intended to be limited to the embodiments shown, but will be given the widest scope consistent with the principles and features disclosed herein.

The invention claimed is:

1. A semiconductor device, comprising:
   a bottom electrode metal layer and a top electrode metal layer located on a semiconductor substrate;
   a resistive layer located between the bottom electrode metal layer and the top electrode metal layer, wherein the transverse width of the resistive layer is greater than the transverse width of the bottom electrode metal layer and/or the top electrode metal layer, and the resistive layer has a variable resistance;
   an oxygen barrier layer located between the bottom electrode metal layer and the top electrode metal layer, wherein the oxygen barrier layer is located above the resistive layer; and
   an oxygen grasping layer located between the bottom electrode metal layer and the top electrode metal layer, wherein the transverse width of the oxygen grasping layer is less than the transverse width of the resistive layer, and the oxygen grasping layer is located above the oxygen barrier layer.

2. The semiconductor device according to claim 1, wherein sidewalls of the bottom electrode metal layer, the top electrode metal layer and the oxygen grasping layer are metal oxidation areas.

3. The semiconductor device according to claim 1,
   wherein the transverse width of the oxygen grasping layer is less than the transverse width of the bottom electrode metal layer and/or the top electrode metal layer; or
   the transverse width of the oxygen grasping layer is greater than the transverse width of the bottom electrode metal layer and/or the top electrode metal layer.

4. The semiconductor device according to claim 3, wherein an outer side of the semiconductor device is covered with a sidewall oxygen isolation protective layer to isolate an oxygen atom outside the semiconductor device.

5. The semiconductor device according to claim 4, wherein a composition material of the resistive layer is one or more of aluminium hafnium oxide (HfAlO), hafnium oxide (HfOx), aluminium oxide (AlOx), and tantalic oxide (TaOx).

6. The semiconductor device according to claim 4, wherein a composition material of the oxygen grasping layer comprises one or more of titanium (Ti), zirconium (Zr), hafnium (Hf), tantalum (Ta), and aluminum (Al).

7. The semiconductor device according to claim 4, wherein a composition material of the oxygen barrier layer and the sidewall oxygen isolation protective layer comprises one or more of aluminum oxide (Al2O3), titanium oxide (TiOx), and titanium oxynitride (TiON).

8. A manufacturing method of a semiconductor device, comprising:
   depositing a bottom electrode metal layer material on a semiconductor substrate;
   depositing a resistive layer material on the bottom electrode metal layer material;
   depositing an oxygen barrier layer material on the resistive layer material;
   depositing an oxygen grasping layer material on the oxygen barrier layer material;
   depositing a top electrode metal layer material on the oxygen grasping layer material;
   patterning the bottom electrode metal layer material, the resistive layer material, the oxygen barrier layer material, the oxygen grasping layer material, and the top electrode metal layer material to form a bottom electrode metal layer, a resistive layer, an oxygen barrier layer, an oxygen grasping layer, and a top electrode metal layer; and
   etching the bottom electrode metal layer, the oxygen grasping layer and the top electrode metal layer, so that the transverse width of the bottom electrode metal layer, the oxygen grasping layer, and the top electrode metal layer are less than the transverse width of the resistive layer.

9. The method according to claim 8, wherein the etching the bottom electrode metal layer, the oxygen grasping layer, and the top electrode metal layer comprises:

etching the bottom electrode metal layer, the oxygen grasping layer, and the top electrode metal layer by a wet etching process, and forming a metal oxidation area on sidewalls of the bottom electrode metal layer, the oxygen grasping layer and the top electrode metal layer.

10. The method according to claim 9, wherein a sidewall oxygen isolation protective layer material is deposited on an outer side of the semiconductor device to form the sidewall oxygen isolation protective layer.

11. The semiconductor device according to claim 1,
wherein the transverse width of the oxygen grasping layer is less than the transverse width of the bottom electrode metal layer and/or the top electrode metal layer; or
the transverse width of the oxygen grasping layer is greater than the transverse width.

* * * * *